United States Patent
Braun et al.

(10) Patent No.: US 9,080,055 B2
(45) Date of Patent: Jul. 14, 2015

(54) PHOTOELECTRIC CONVERSION DEVICE USING TIOF2 AS SEMICONDUCTOR

(71) Applicants: Max Josef Braun, Wedemark (DE); Johannes Eicher, Sehnde (DE); Dieter Woehrle, Bremen (DE)

(72) Inventors: Max Josef Braun, Wedemark (DE); Johannes Eicher, Sehnde (DE); Dieter Woehrle, Bremen (DE)

(73) Assignee: SOLVAY SA, Brussels (BE)

( * ) Notice: Subject to any disclaimer, the term of this patent is extended or adjusted under 35 U.S.C. 154(b) by 0 days.

(21) Appl. No.: 13/938,650

(22) Filed: Jul. 10, 2013

(65) Prior Publication Data

US 2013/0291930 A1 Nov. 7, 2013

Related U.S. Application Data

(63) Continuation of application No. PCT/EP2012/050502, filed on Jan. 13, 2012.

(60) Provisional application No. 61/433,179, filed on Jan. 14, 2011.

(30) Foreign Application Priority Data

Jun. 17, 2011 (EP) .................................. 11170427

(51) Int. Cl.
*H01G 9/20* (2006.01)
*C09B 47/067* (2006.01)
(Continued)

(52) U.S. Cl.
CPC .............. *C09B 47/067* (2013.01); *C09B 47/045* (2013.01); *C09B 47/0671* (2013.01); *C09B 47/0673* (2013.01); *C09B 47/0675* (2013.01); *C09B 47/0676* (2013.01); *H01G 9/2059* (2013.01); *H01L 31/18* (2013.01); *H01L 51/0078* (2013.01); *H01G 9/2031* (2013.01); *H01L 51/0092* (2013.01); *Y02E 10/542* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 2002/0062857 A1* | 5/2002 | Choi et al. | | 136/252 |
| 2006/0137739 A1* | 6/2006 | Imoto et al. | | 136/263 |
| 2007/0017569 A1* | 1/2007 | Gui et al. | | 136/256 |

FOREIGN PATENT DOCUMENTS

| | | |
|---|---|---|
| JP | 2006-143680 A | 6/2006 |
| WO | WO 2008037695 A2 | 4/2008 |

(Continued)

OTHER PUBLICATIONS

J. Zhu, et al., "Aerosol-spraying synthesis of SiO2/TiO2 nanocomposites and conversion to porous TiO2 and single-crystalline TiOF2", Chemical Communications, p. 5394-5396 (2009).*

(Continued)

*Primary Examiner* — Jeffrey T Barton
*Assistant Examiner* — Eric R Smith

(57) ABSTRACT

Use of $TiOF_2$ as semiconductor in a photoelectric conversion device, in particular in a dye-sensitized solar cell. A photoelectric conversion device, in particular a dye-sensitized solar cell, comprising a semiconductor layer containing at least $TiOF_2$. The $TiOF_2$ is preferably used in the form of nanoparticles. Dyes, method(s) of making them, and their use in photoelectric conversion devices, especially in dye-sensitized solar cells. A dye-sensitized solar cell comprising at least one fluorinated compound as a dye and at least $TiOF_2$ as semiconductor.

15 Claims, 1 Drawing Sheet

(51) Int. Cl.
*H01L 31/18* (2006.01)
*C09B 47/04* (2006.01)
*H01L 51/00* (2006.01)

(56) References Cited

FOREIGN PATENT DOCUMENTS

| WO | WO 2010069906 A1 | 6/2010 |
|----|------------------|--------|
| WO | WO 2012172107 A1 | 12/2012 |
| WO | WO 2012175536 A1 | 12/2012 |

OTHER PUBLICATIONS

N. Todorova, "Structure tailoring of fluorine-doped TiO2 nanostructured powders", Materials Science and Engineering B 152, p. 50-54 (2008).*

D. Li et al., "Fluorine-doped TiO2 powders prepared by spray pyrolysis and their improved photocatalytic activity for decomposition of gas-phase acetaldehyde", Journal of Fluorine Chemistry 126 p. 69-77 (2005).*

Reddy, P.Y, et al—"Efficient Sensitization of Nanocrystalline TiO2 Films by a Near-IR-Absorbing Unsymmetrical Zinc Phthalocyanine", 2007, Angew Chem Int Ed, vol. 46, Issue No. 3, Wiley-VCH Verlag GmbH & Co. KGaA, Weinheim, pp. 373-376; DOI: 10.1002/anie.200603098; 4 pgs.

Giribabu, L., et al—"Unsymmetrical alkoxy zinc phthalocyanine for sensitization of nanocrystalline TiO2 films", 2007, Solar Energy Materials & Solar Cells, vol. 91, Issue No. 17, Elsevier BV, pp. 1611-1617; 7 pgs.

Bakboord, Joan V., et al—"Non-uniformly substituted phthalocyanines and related compounds: alkylated tribenzo-imidazolo[4,5]-porphyrazines", 2000, Journal of Porphyrins and Phthalocyanines, vol. 4, Issue No. 5, John Wiley & Sons, Ltd., pp. 510-517; XP-002661952; 8 pgs.

Cook, M. J., et al—"Phthalocyanine-related Macrocycles: Cross Cyclotetramerisation Products from 3,4-Dicyanothiophenes, 2,3-Dicyanothiophene and 3,6-Dialkylphthalonitriles", 2000, Tetrahedron, vol. 56, Issue No. 24, Pergamon, Elsevier, Science Ltd., pp. 4085-4094; XP-002661953; 10 pgs.

Shang, Huixia, et al—"The effect of anchoring group number on the performance of dye-sensitized solar cells", Apr. 18, 2010, Dyes and Pigments, vol. 87, Issue No. 3, pp. 249-256, Elsevier, XP-002661954; 8 pgs.

Ooyama, Yousuke, et al—"Molecular Designs and Syntheses of Organic Dyes for Dye-Sensitized Solar Cells", 2009, European Journal of Organic Chemistry, vol. 18, pp. 2903-2934; Wiley-VCH Verlag GmbH & Co. KGaA, Weinheim, XP-002661955, DOI: 10.1002/ejoc.200900236; 32 pgs.

Brinkmann, H., et al—"Fluorinated phthalocyanines as molecular semiconductor thin films", 2008, Physica Status Solidi (a), Applications and Materials Science, vol. 205, Issue No. 3, Wiley-VCH Verlag GmbH & Co. KGaA, Weinheim, pp. 409-420; DOI 10.1002/pssa.200723391; 13 pgs.

Gerdes, R., et al—"Rational design of a reactive yet stable organic-based photocatalyst", 2009, Dalton Transactions, vol. 21, Issue No. 7, Feb. 21, 2009, pp. 1098-1100; DOI: 10.1039/b822111c, The Royal Society of Chemistry; 4 pgs.

Kiel, C., et al—"Growth and characterization of thin films prepared from perfluoro-isopropyl-substituted perfluorophthalocyanines", 2009, Thin Solid Films, vol. 517, pp. 4379-4384; Elsevier BV, DOI: 10.1016/j.tsf.2009.01.070; 6 pgs.

R. Grunwald and H. Tributsch, "Mechanism of Instability in Ru-Based Dye Sensitization Solar Cells" J. Phys. Chem. B (1997), vol. 101, pp. 2564-2575.

Hashimoto et al. "TiO2 Photocatalysis: A Historical Overview and Future Prospects" Japanese Journal of Applied Physics (2005), vol. 44, No. 12, pp. 8269-8285.

Moan, J. (2001). Visible light and UV radiation. Radiation at Home, Outdoors and in the Workplace (D. Brune, R. Helborg, B. R. R. Persson, and R. Paakkonen, Eds.) Scandinavian Science Publishers., Oslo, Norway.

* cited by examiner

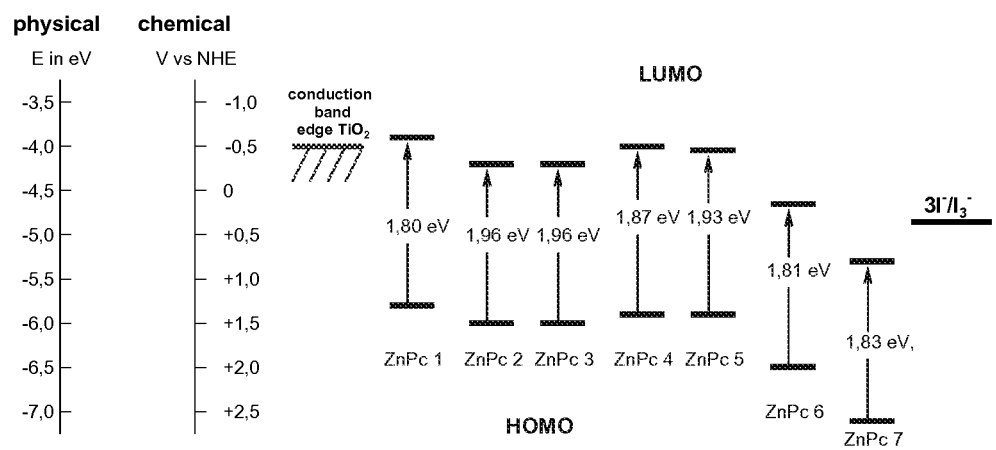

PHOTOELECTRIC CONVERSION DEVICE USING TIOF2 AS SEMICONDUCTOR

CROSS-REFERENCE TO RELATED APPLICATIONS

This application is a continuation of International Application no. PCT/EP2012/050502 filed Jan. 13, 2012, which claims priority to U.S. provisional application No. 61/433,179 filed on Jan. 14, 2011 and to European application No. 11170427.6 filed on Jun. 17, 2011, the whole content of each of these applications being incorporated herein by reference for all purposes.

TECHNICAL FIELD

The present invention relates to dye compounds, in particular dye compounds based on phthalocyanine and naphthalocyanine analogues, more particularly on fluorinated phthalocyanine analogues, method(s) of making them, and their use as dyes in photoelectric conversion devices, especially in dye-sensitized solar cells (DSSC).

BACKGROUND OF THE INVENTION

Conventional solar cells convert light into electricity by exploiting the photovoltaic effect that exists at semiconductor junctions. In other words, the commercial solar cells absorb energy from visible light and converts excited charge carriers thereof to electric energy. At present, the main commercial solar cells are silicon-based solar cells. For a silicon-based solar cell, there are shortcomings in that high energy costs for material processing is required and many problems to be addressed such as environmental burdens and cost and material supply limitations are involved. For an amorphous silicon solar cell, there are also shortcomings in that energy conversion efficiency decreases when used for a long time due to deterioration in a short period.

Recently, many attempts have been undertaken to develop low-cost organic solar cells, whereby development of one particular type of solar cell which is a dye-sensitized solar cell (DSSC) is accelerated that is a class of thin film solar cells, is based on a semiconductor formed between a photo-sensitized anode and an electrolyte, and generally uses an organic dye to absorb incoming light to produce excited electrons.

The DSSC offers the prospect of a cheap and versatile technology for large scale production of solar cells. The dye-sensitized solar cell (DSSC) is formed by a combination of organic and inorganic components that could be produced at a low cost. The dye-sensitized solar cells have advantages over silicon-based solar cells in terms of simplified processing steps, low fabrication cost, transparency and pleochroism. The dye-sensitized solar cells can be fabricated from flexible substrates to function as cells of mobility and portability. Dye-sensitized solar cells have also the advantage to be light-weight.

The dye-sensitized solar cells have lower energy (photo-electric) conversion efficiency over that of the silicon-based solar cells such that a wide range of researches are briskly under way to enhance the energy conversion efficiency. In order to improve the energy conversion efficiency, extension of wave length up to infrared regions is being waged with great concern. It is known that the energy bandgap (eV) for use in solar cells must exceed 1.4 eV (electron volt).

The basic element of a DSSC is generally a $TiO_2$ (titanium dioxide) nanoparticulate structure sensitized with dye molecules to form its core of a DSSC. The assembly of titanium dioxide nanoparticles is well connected to their neighbors. $TiO_2$ is the preferred material for the nanoparticles since its surface is highly resistant to the continued electron transfer. However, $TiO_2$ only absorbs a small fraction of the solar photons (those in the UV). The dye molecules attached to the semiconductor surface are used to harvest a great portion of the solar light.

The main dye molecules consist on one metal atom and a large organic structure that provides the required properties (wide absorption range, fast electron injection, and stability), such as ruthenium complexes. The dye is sensible to the visible light. The light creates and excitation in the dye that consists on a highly energetic electron, which is rapidly injected to the semiconductor (usually $TiO_2$) nanoparticles. The nanoparticulate semiconductor functions as the transporter of light induced electrons towards the external contact, a transparent conductor that lies at the basis of the semiconductor (usually $TiO_2$) film.

Meanwhile, phthalocyanine is an intensely colored macrocyclic compound that is widely used in dyeing. Phthalocyanines form coordination complexes with most elements of the periodic table. These complexes are also intensely colored and also are used as dyes. Approximately 25% of all artificial organic pigments are phthalocyanine derivatives.

Phthalocyanine (Pc) compound used as a dye in electrodes for solar cells has advantages such as high transmittivity relative to visible light, excellent selective absorption power in the near infrared region, high heat resistance, high weatherability and high thermotolerance, so that the phthalocyanine compound has a wide range of applications.

For instance, the use of zinc phthalocyanines in DSSCs has been disclosed by Md. Nazeeruddin et al., Angew. Chem. Int. Ed., 2007, 46, 373-376 and by M. Grätzel et al., Solar Energy Materials & Solar Cells, 2007, 91, 1611-1617.

However, there is still a need for dyes that could lead to an improvement of DSSCs, in particular to improved conversion efficiency. More particularly, there is still a need for dyes exhibiting a broad spectrum of adsorbed light (i.e. absorbing as much of the solar spectrum as possible), a high molar extinction coefficient, contributing to the long-term stability of the device and/or allowing an improved conversion efficiency.

SUMMARY

In view of the above, the purpose of the present invention is to provide new dyes showing particularly advantageous properties when used in photoelectric conversion devices, in particular in dye sensitized solar cells (DSSC), especially an improved conversion efficiency of the devices or cells More particularly, the purpose of the present invention is to provide new dyes having a broad absorption spectrum, particularly in the visible and near-IR regions, i.e. absorbing as much of the solar spectrum as possible. The new dyes of the present invention should also exhibit a high molar extinction coefficient. Therefore phthalocyanine and naphthalocyanine analogues absorbing up to around 850 nm with high extinction coefficients of $>10^5$ L mol$^{-1}$ cm$^{-1}$ are used. Such dyes should preferably exhibit the very high or even higher electron injection speed into a semiconductor as previous dyes and generally have an improved communication and directionality of the electrons when being transferred from the sensitizer to the semiconductor electrode. Such dyes should also contribute to the long-term stability of such devices, for example, better resistance to water contained in trace amounts in the devices and better shielding of the Ti-electrode against corrosion through components present in the electrolyte, such as the triiodide/iodide couple. The dyes should also be anchored and/or persistently attached to the semiconductor surface and/or to the surface of the photoelectrode. The attachment should be such that the dye stays attached over extended periods of several months and preferably years.

BRIEF DESCRIPTION OF THE DRAWING

FIG. 1 shows the HOMO/LUMO calculated levels for compounds ZnPc 1~7 provided in the Examples.

DETAILED DESCRIPTION

One embodiment of the present invention relates to a compound, especially a dye compound, based on phthalocyanine and naphthalocyanine analogues, comprising an element M in a macrocyclic structure having a formula (X):

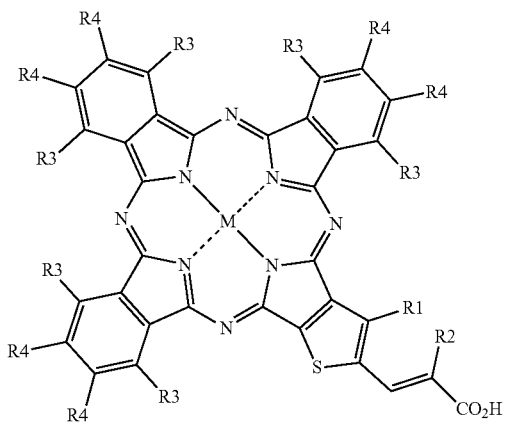

wherein:
- M is 2H (metal free analogue), zinc (Zn(II)), magnesium (Mg(II)), Al(III)X, Si(IV)$X_2$, Sn(IV)$X_2$ wherein X is selected from halides, OH and OR with R being an alkyl or aryl group;
- $R_1$ is H or an alkyl group substituted by at least one halogen atom;
- $R_2$ is —CN, —COOH or an alkyl group substituted by at least one halogen atom;
- $R_3$ is independently selected from H, F, —$C_nF_{2n+1}$, —OR', and N$R_2$'; and
- $R_4$ are independently selected from H, F, —$C_nF_{2n+1}$, —OR', —N$R'_2$, and from groups forming an optionally substituted aromatic cycle, adjacent to the external aromatic cycles of the macrocyclic structure, with R' being independently selected from H or alkyl or aryl groups, optionally fluorinated.

In the compounds of the present invention, M is preferably selected from zinc (Zn(II)), magnesium (Mg(II)), Al(III)X, Si(IV)$X_2$, Sn(IV)$X_2$ wherein X is selected from halides, preferably from F, Cl and Br; more preferably from Zn(II) and stannous halide (SnHa$l_2$). M may also advantageously be selected from 2H, which corresponds to the metal free analogues and which may result also in high excited state life times for efficient electron transfer to the semiconductor.

In the compounds of the present invention, R' is preferably selected from optionally fluorinated alkyl or aryl groups, more preferably from perfluorinated alkyl (—$C_nF_{2n+1}$) or aryl groups, for instance from (per)fluorinated methyl, ethyl, n-propyl, i-propyl, n-butyl, t-butyl and phenyl groups. R' also can be an optionally substituted terphenyl group, such as alkoxyterphenyl, in particular.

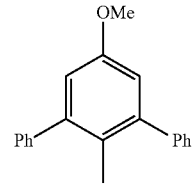

For example, R' may be selected from the group consisting of methyl, ethyl, n-propyl, i-propyl, n-butyl, t-butyl, phenyl, and their corresponding perfluorinated groups such as —$CF_3$, —$C_2F_5$, heptafluoroisopropyl (—CF(C$F_3$)$_2$), or hexafluoroisopropyl (—CH(C$F_3$)$_2$).

In the present invention, $R_1$ may be selected from H and alkyl groups substituted by at least one halogen atom, in particular a perhalogenated alkyl group, for example —$CH_2F$, —$CHF_2$, —$CF_3$, —$CF_2Cl$, and —$C_2F_5$. $R_1$ may more particularly be selected from H, —$CF_3$ or —$C_2F_5$.

In the present invention $R_2$ may be selected from —CN and alkyl groups substituted by at least one halogen atom. A particular example of alkyl groups substituted by at least one halogen atom is a perhalogenated alkyl group, for instance —$CH_2F$, —$CHF_2$, —$CF_3$, —$CF_2Cl$, and —$C_2F_5$. $R_2$ may more especially be selected from —CN and —$CF_3$. In another aspect, $R_2$ may be —COOH.

In the compounds of the present invention, $R_3$ are the same or different, especially the same, and are advantageously selected from —$C_nF_{2n+1}$; —OR', and N$R_2$'; preferably from —$C_nF_{2n+1}$, —O$C_nH_{2n+1}$ and —O$C_nF_{2n+1}$, for instance

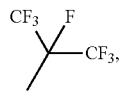

—$OCH_3$, —$OCF_3$, —OCF(C$F_3$)$_2$, or —OCH(C$F_3$)$_2$.

In the compounds of the present invention, $R_4$ are the same or different, usually the same, and are typically selected from H, F, —$C_nF_{2n+1}$, —OR', and N$R_2$';
preferably from —$C_nF_{2n+1}$, —O$C_nH_{2n+1}$ and —O$C_nF_{2n+1}$, for instance

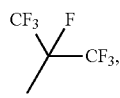

—$OCH_3$, —$OCF_3$, —OCF(C$F_3$)$_2$, or —OCH(C$F_3$)$_2$. In a more specific embodiment, $R_4$ are selected from groups forming an optionally substituted aromatic cycle, adjacent to the external aromatic cycles of the macrocyclic structure. In said more specific embodiment, the aromatic cycle is especially a C6 aromatic cycle, thus forming a naphthalene moiety with the benzene moiety of the macrocyclic structure. In this specific case, the compound will be a naphthalocyanine analogue. Said external aromatic cycle may optionally be substituted, especially by halogen atoms, in particular with F atoms.

In some preferred embodiments, $R_1$ is —$CF_3$ or —$C_2F_5$. In some embodiments, $R_1$ is H and $R_2$ is —CN. In some other embodiments, $R_2$ is —CN, and $R_4$ is H. In some alternate embodiments, $R_2$ is —$CF_3$, and $R_4$ is H. In some yet alternate embodiments, $R_2$ is —$CF_3$, and $R_4$ is F.

A specific embodiment of the present invention relates to a compound comprising an element M in a macrocyclic structure having a formula (X):

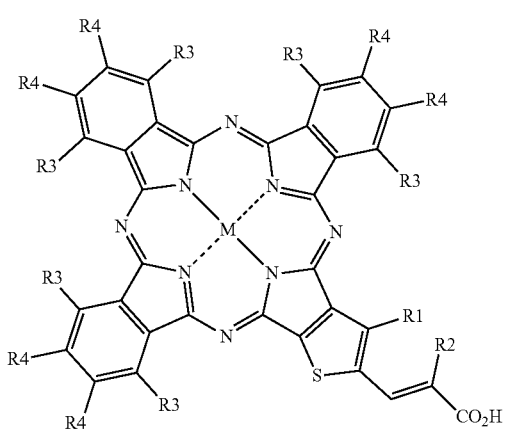

(X)

wherein:
M is zinc (Zn) or stannous halide (SnHal2);
$R_1$ is H, —$CF_3$, or —$C_2F_5$;
$R_2$ is —$CF_3$, —COOH or —CN;
$R_3$ is —$OCF_3$, —$OCH_3$, or

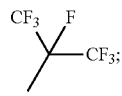

and
$R_4$ is H or F.

In this specific embodiment, $R_2$ may be $CF_3$ or —CN. In another aspect of this specific embodiment, $R_2$ is —COOH.

Any substituted benzene, for instance methoxy or fluoromethoxy benzenes, can be combined with any thiophene moiety mentioned hereafter. In an especially advantageous embodiment, methoxy benzenes or combined with any thiophene moiety. In another especially advantageous embodiment, fluorinated benzenes are combined with a fluorinated thiophene moiety.

Another embodiment of the present invention relates to a compound comprising the element M (same as defined above) in a macrocyclic structure having a similar formula than formula (X), but which comprises more than one thiophenic moiety.

A preferred compound according to the present invention, comprising the element M (same as defined above), has a structure of formula being selected from the group consisting of:

Structure I

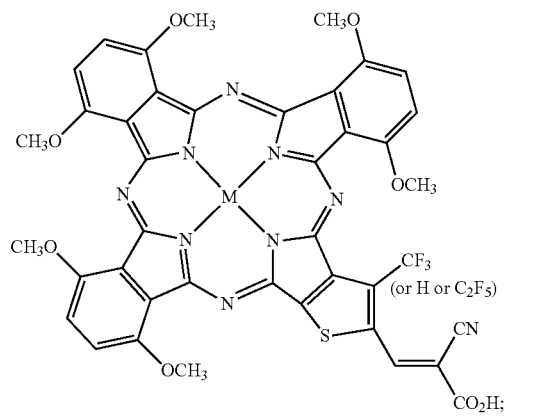

Structure II

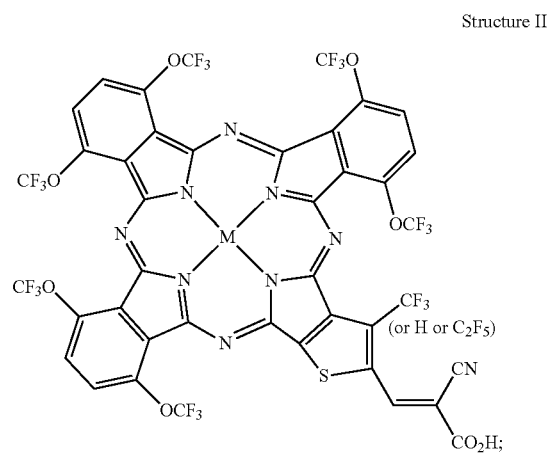

Structure III

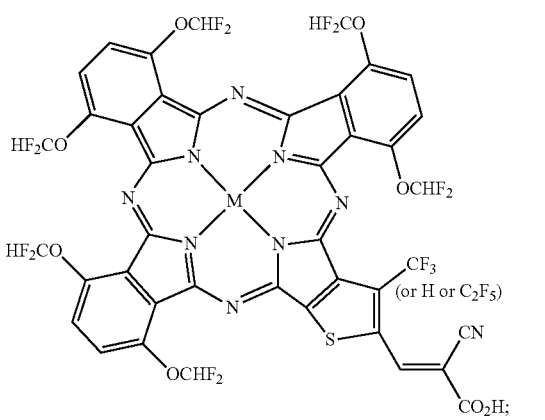

Structure IV
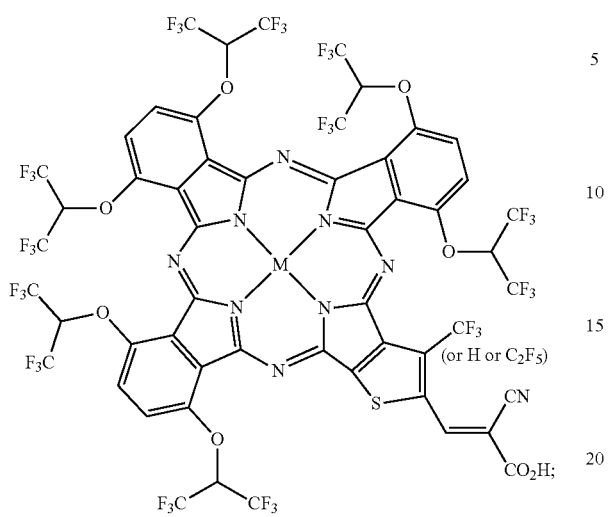
Structure V
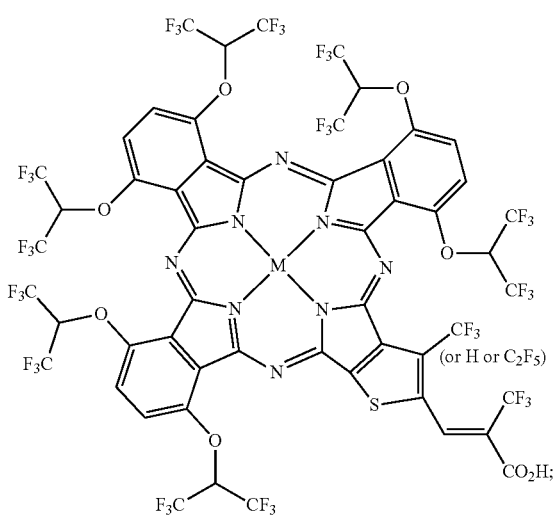
Structure VI
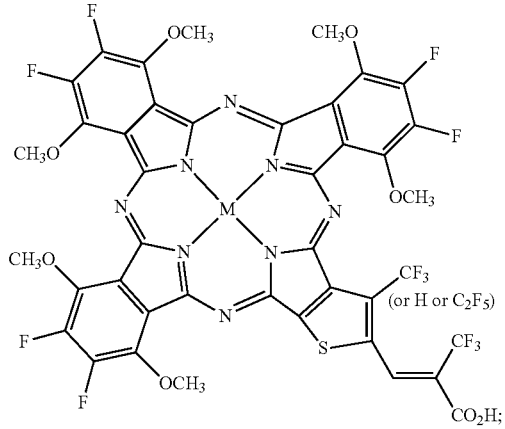
Structure VII
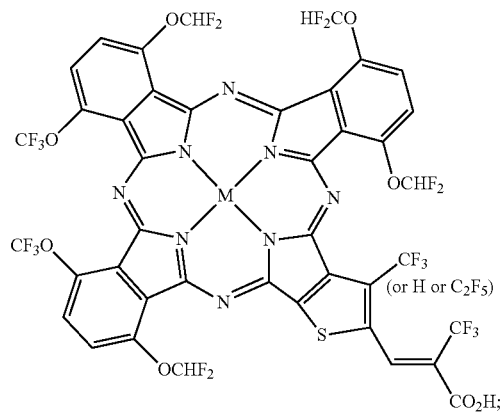
Structure VIII
Structure IX -continued
Structure X
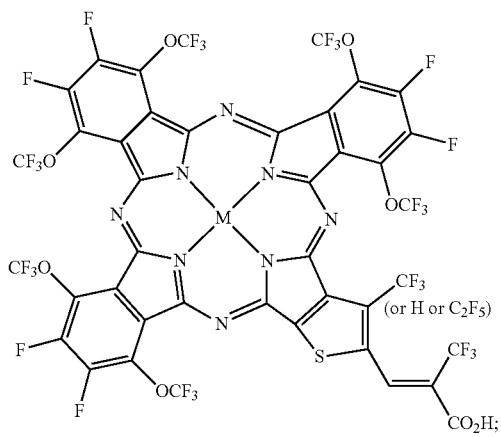
Structure XI
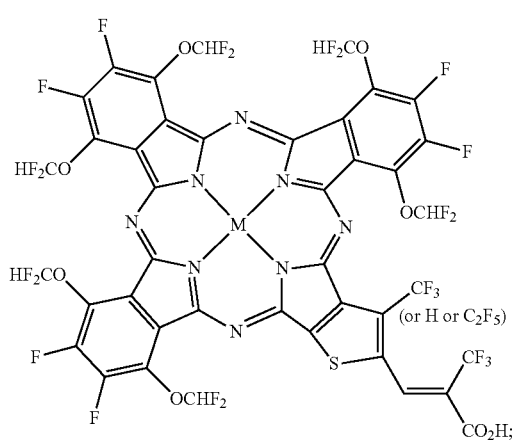
Structure XII
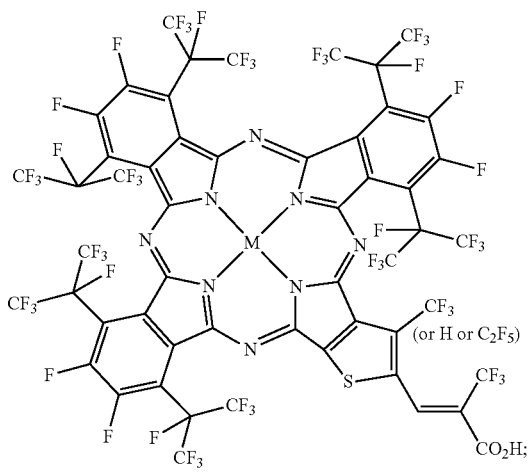
Structure XIII
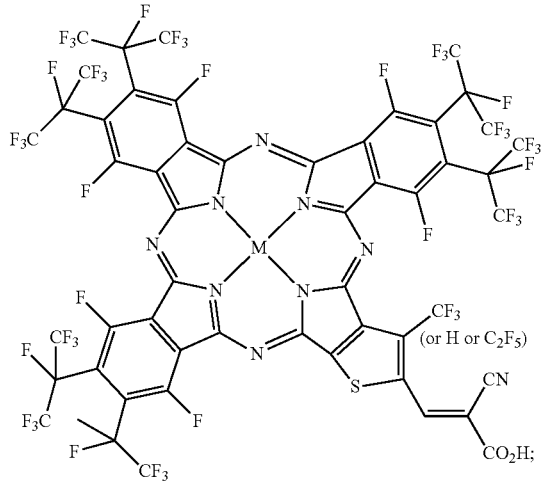
Structure XIV
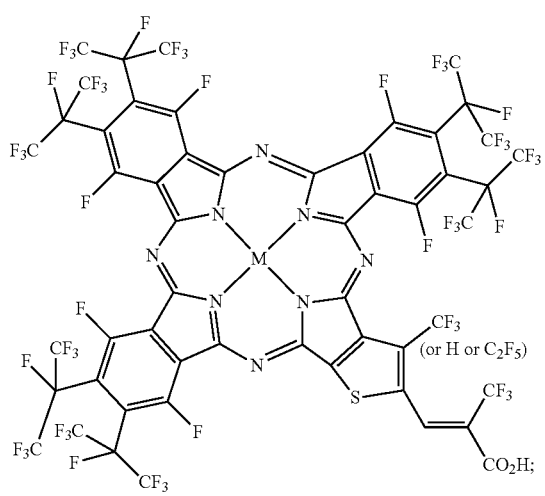
Structure XV
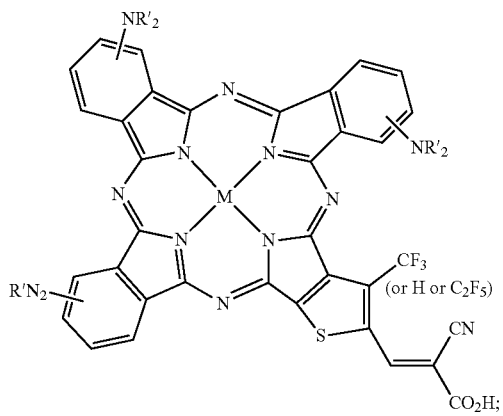

Structure XVI
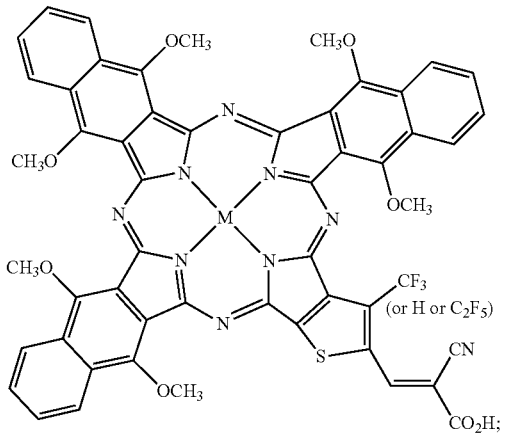
Structure XVII
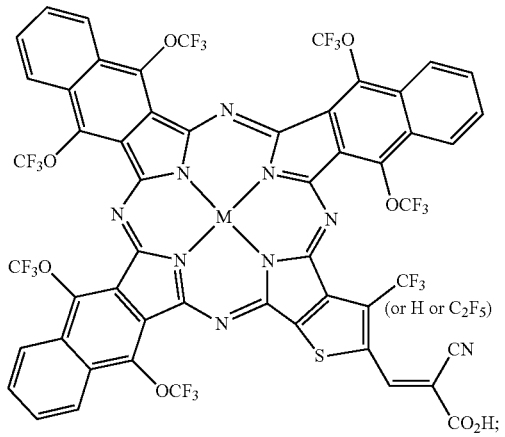
Structure XVIII
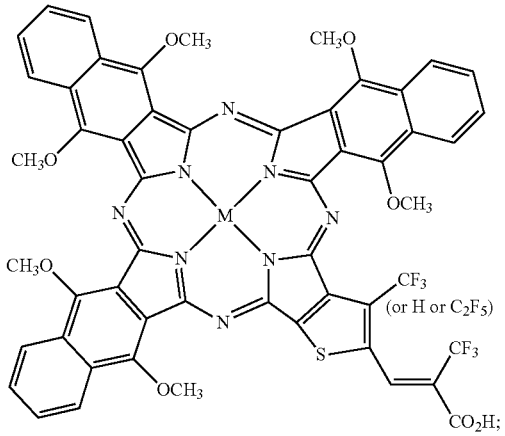
Structure XIX
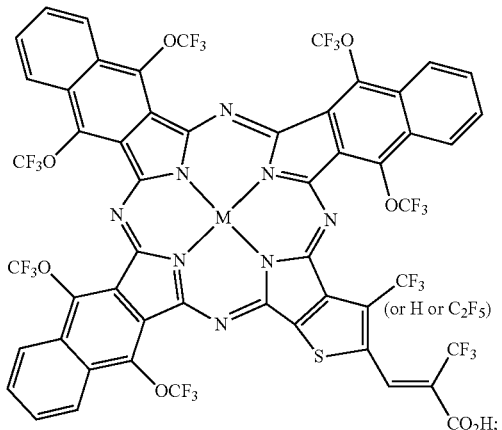
Structure XX
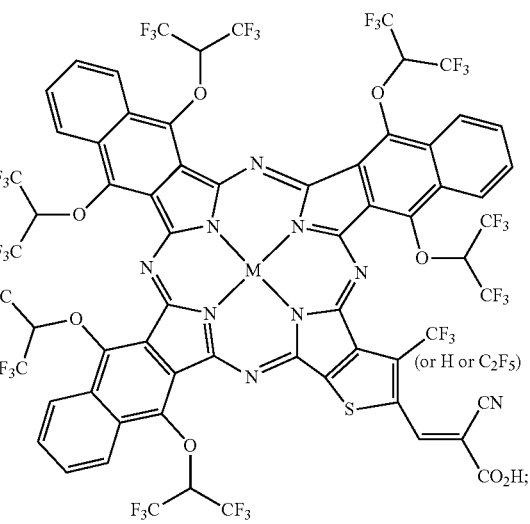
Structure XXI
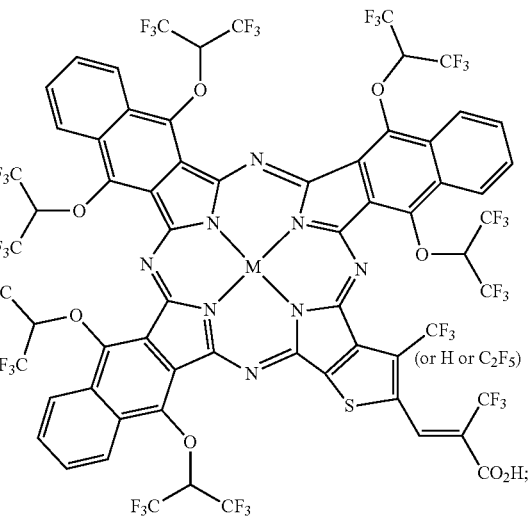

Structure XXII
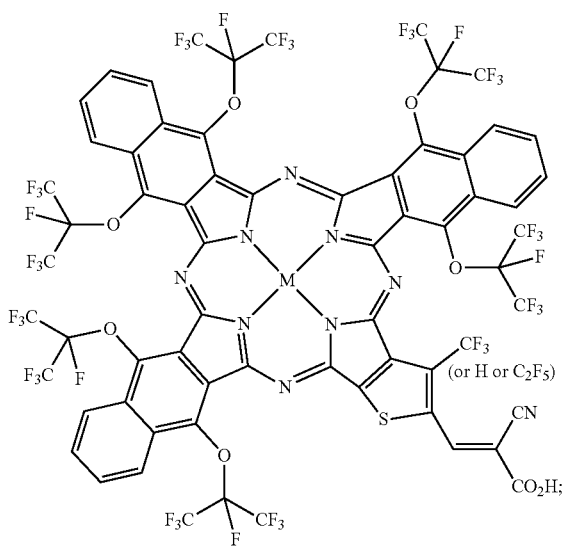
Structure XXIII
Structure XXIV
Structure XXV
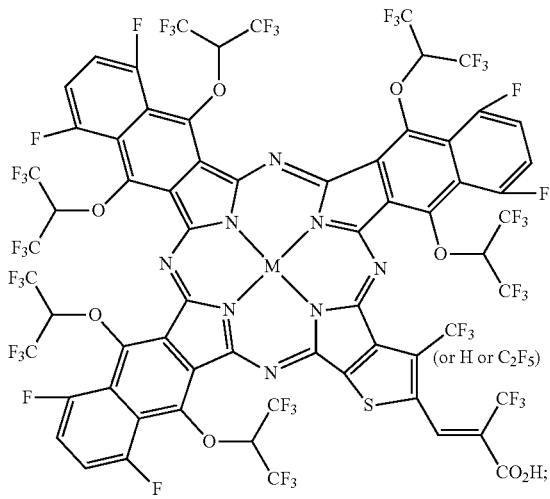
Structure XXVI
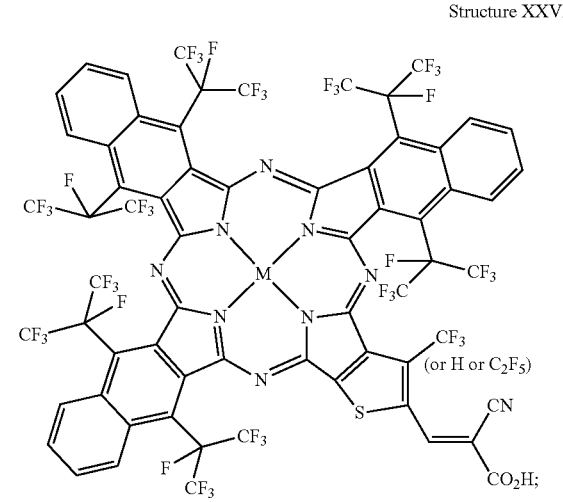
Structure XXVII
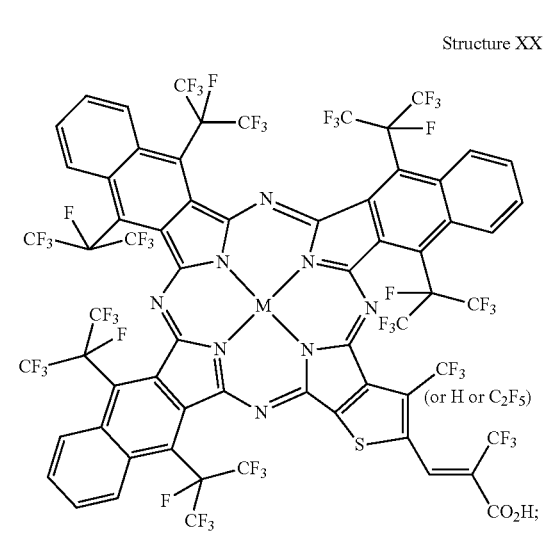

-continued

Structure XXVIII

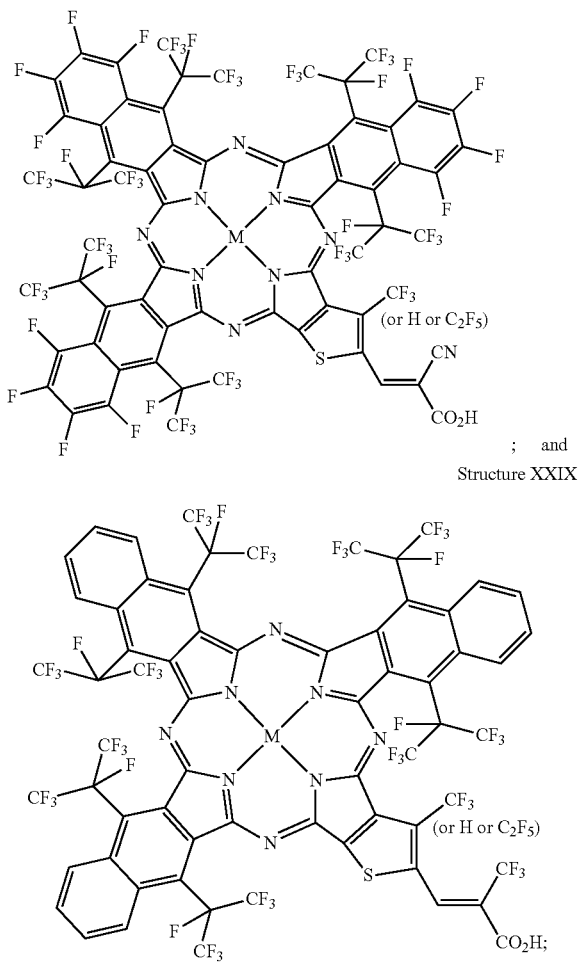

; and

Structure XXIX preferably from Structure I, II, V, VI, X and XII.

Any of the compounds of the present invention described herein is a dye which is suitable for use photoelectric conversion devices, especially in dye-sensitized solar cells (DSSC).

The present invention also relates to the use of $TiOF_2$ (titanyl oxyfluoride, titanium oxyfluoride or titanium fluoride oxide) as semiconductor in a photoelectric conversion device, in particular in a dye sensitized solar cell. $TiOF_2$ has the conduction band level at lower energy compared to $TiO_2$ which should improve the photo-induced electron transfer from the excited dye to the semiconductor. The present invention therefore also relates to a photoelectric conversion device, in particular a dye sensitized solar cell (DSSC), comprising a semiconductor layer containing at least $TiOF_2$ on a transparent conducting glass electrode (e.g. F doped $SnO_2$ as conducting material). The $TiOF_2$ is preferably used in the form of $TiOF_2$ nanoparticles, in particular $TiOF_2$ particles having a mean primary particle size from 15 to 50 nm. The layer thickness is typically from 500 nm to 10 µm. The $TiOF_2$ may be used as the sole semiconductor in the DSSC semiconductor layer or may be combined in mixture with any other suitable semiconductor compound, for instance $TiO_2$. Another possibility is to have at first a dense $TiO_2$ layer on the conducting glass followed by a nanoporous $TiOF_2$ layer.

Fluorinated compounds according to the present invention are especially advantageous, in particular when combined with $TiOF_2$ used as semiconductor in dye sensitized solar cells. Indeed, without being bound by any theory, it is believed that the conduction band edge of $TiOF_2$ is lower in energy compared to the conduction band of $TiO_2$ while the fluorinated compounds of the present invention exhibit a lower LUMO level compared to similar non-fluorinated compounds. Such combination is thus especially advantageous.

The present invention further relates to a photoelectric conversion device, preferably a dye-sensitized solar cell, which comprises the compound of the present invention. The compound of the present invention is used as a dye, in particular as a sensitizing dye, in such device or cell.

In a preferred embodiment, the present invention relates to a dye-sensitized solar cell comprising at least one fluorinated compound according to the present invention as a dye and at least $TiOF_2$ as semiconductor. The fluorinated compound according to the present invention may be fluorinated via at least part of its $R_1$, $R_2$, $R_3$ or $R_4$ groups. The fluorinated compound according to the present invention may for instance be selected from any compound of Structure I to XXIX wherein $R_1$ is selected from halogenated groups as defined above, especially from any compound of Structure II, III, IV, V, VI, VII, VIII, XI, VII and VIII, more particularly from any compound of Structure II, III, IV, V and VI.

The present invention further relates to a method for making the above-mentioned compounds. The method comprises utilizing one or more aromatic dinitriles, for instance fluorinated alkoxyphthalonitriles, and one or more thiophenes as building blocks for the macrocyclic structure. The method may further comprise utilizing an M-containing precursor. The present invention further relates to a compound obtained by such method. The aromatic dinitriles may be selected, for example, from the group consisting of aryloxyphthalonitriles, aryloxynaphthalonitriles, alkylthiophthalonitriles and alkylthionaphthalonitriles.

The thiophene used in the preparation of the compounds of the present invention is preferably fluorinated.

In the method of the present invention, it is especially advantageous to use a fluorinated phthalonitrile or a fluorinated alkoxyphthalonitrile and a fluorinated 2,3-dicyanothiophene as building blocks for the preparation of the macrocyclic structure.

The method may comprise using a single aromatic dinitrile (for instance a fluorinated alkoxyphthalonitrile) building block (one formula); alternatively the method may comprise using two or more aromatic dinitriles (for instance fluorinated alkoxyphthalonitriles) of different formulae. The method may comprise using a single thiophene building block; alternatively the method may comprise using two or more thiophene building blocks of different formulae, including a mixture of 2,3- and 3,4-dicyanothiophenes.

Aromatic dinitriles for manufacturing the compounds of the present invention may be selected from any suitably substituted aromatic dinitriles of following formula:

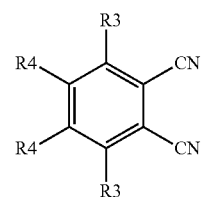

wherein $R_3$ and $R_4$ have the same meaning as defined above for compound of formula (X). In particular, the aromatic dinitriles may be selected from suitably substituted phthalonitriles and naphthalodinitriles, including among others alkoxyphthalonitriles, aminophthalonitriles, amino-alkoxyphthalonitriles, fluorinated phthalonitriles, fluorinated alkoxyphthalonitriles, or optionally substituted naphthalodinitriles such as alkoxy naphthalodinitriles, fluorinated naphthalodinitriles, or fluorinated alkoxy naphthalodinitriles.

Suitable alkoxyphthalonitriles may for instance be selected from compounds of following formula (A):

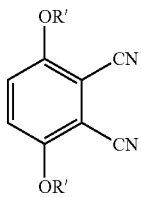

(A)

wherein R' has the same meaning as defined above for compound of formula (X). R' may for instance be selected from optionally fluorinated alkyl or aryl groups such as methyl, ethyl, n-propyl, i-propyl, n-butyl, i-butyl, t-butyl, phenyl and their corresponding perfluorinated groups such as —CF$_3$, —C$_2$F$_5$, or hexafluoroisopropyl (—CH(CF$_3$)$_2$).

Suitable aminophthalonitriles may be selected from compounds of following formula (B):

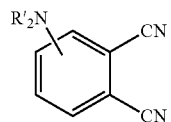

(B)

wherein R' has the same meaning as defined above for compound of formula (X). R' may for example be selected from alkyl and aryl groups such as methyl, ethyl, n-propyl, i-propyl, n-butyl, i-butyl, t-butyl and phenyl groups. The aminophthalonitriles are preferably from 4- and 4,5-substituted phthalonitriles.

Amino-alkoxyphthalonitriles of following formula (C) may also suitably be used in the present method:

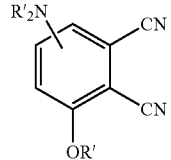

(C)

wherein R' has the same meaning as defined above for compound of formula (X) and more preferably the same meaning as defined for compounds of formula (A) for the —OR' group and of formula (B) for the NR'$_2$ group.

Suitable fluorinated phthalonitriles and fluorinated alkoxyphthalonitriles may be selected from the group consisting of:

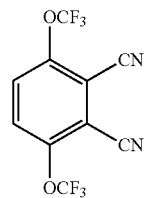

(D)

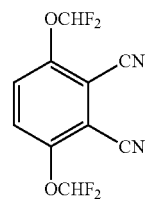

(E)

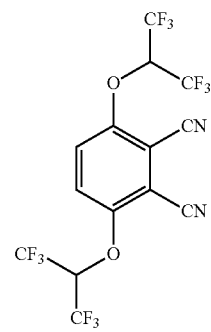

(F)

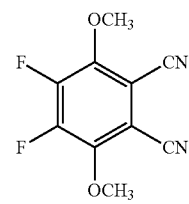

(G)

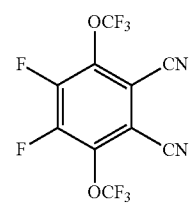

(H)

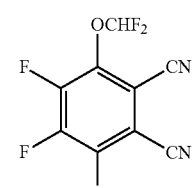

(J)

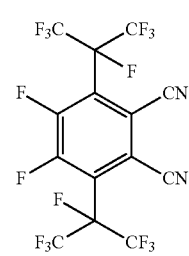

(K)

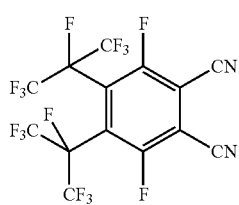
(L)

preferably from (D), (E), (G), (H), and (J).

Suitable alkoxy naphthalodinitriles are for instance compounds of following formula (M):

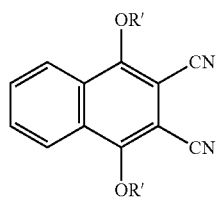
(M)

wherein R' has the same meaning as defined above for compound of formula (X). R' may for instance be selected from optionally fluorinated alkyl or aryl groups such as methyl, ethyl, n-propyl, i-propyl, n-butyl, i-butyl, t-butyl, phenyl and their corresponding perfluorinated groups such as —CF$_3$, —C$_2$F$_5$, heptafluoroisopropyl (—CF(CF$_3$)$_2$), or hexafluoroisopropyl (—CH(CF$_3$)$_2$), more preferably from methyl, ethyl, t-butyl, phenyl, heptafluoroisopropyl (—CF(CF$_3$)$_2$), and hexafluoroisopropyl (—CH(CF$_3$)$_2$) groups, most preferably methyl, heptafluoroisopropyl (—CF(CF$_3$)$_2$), and hexafluoroisopropyl (—CH(CF$_3$)$_2$) groups.

Suitable fluorinated alkoxy naphthalodinitriles are for instance compounds of following formulas:

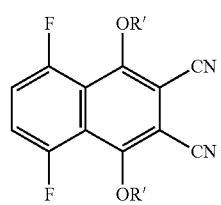
(N)

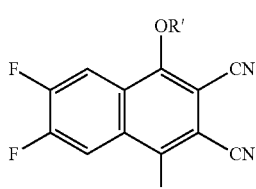
(O)

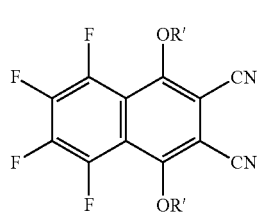
(P)

wherein R' has the same meaning as defined above for compound of formula (X). R' may for instance be selected from optionally fluorinated alkyl or aryl groups such as methyl, ethyl, n-propyl, i-propyl, n-butyl, i-butyl, t-butyl, phenyl and their corresponding perfluorinated groups such as —CF$_3$, —C$_2$F$_5$, heptafluoroisopropyl (—CF(CF$_3$)$_2$), or hexafluoroisopropyl (—CH(CF$_3$)$_2$), more preferably from methyl, ethyl, t-butyl, phenyl, heptafluoroisopropyl (—CF(CF$_3$)$_2$), and hexafluoroisopropyl (—CH(CF$_3$)$_2$) groups, most preferably methyl, heptafluoroisopropyl (—CF(CF$_3$)$_2$), and hexafluoroisopropyl (—CH(CF$_3$)$_2$) groups.

Suitable fluorinated naphthalodinitriles are for example compounds of following formula:

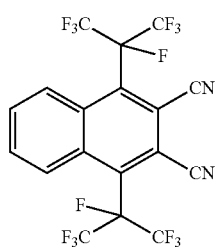
(Q)

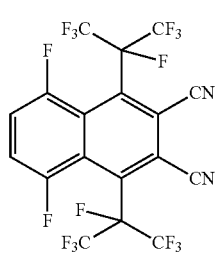
(R)

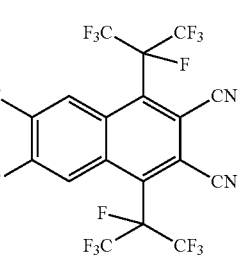
(S)

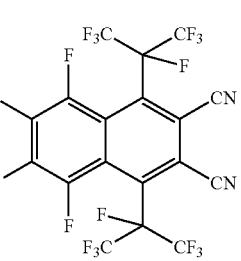
(T)

Suitable aryloxyphthalonitriles are for example compounds of following formula:

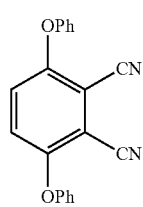
(U)

-continued

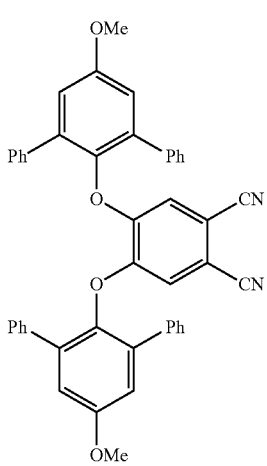

Suitable aryloxynaphthalonitriles are for example compounds of following formula:

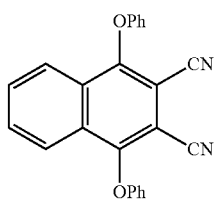
(W)

Suitable alkylthiophthalonitriles are for example compounds of following formula:

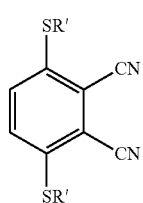
(X)

wherein R' has the same meaning as defined above for compound of formula (X).

Suitable alkylthionaphthalonitriles are for example compounds of following formula:

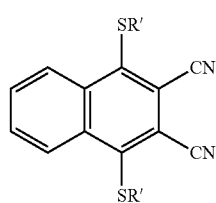
(Y)

wherein R' has the same meaning as defined above for compound of formula (X).

The alkoxyphthalonitrile of formula (A) may be prepared as follows, starting from commercially available 2,3-dicyanohydroquinone:

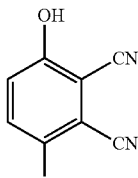 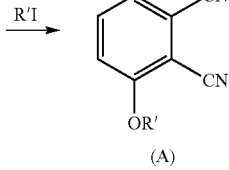
(A)

The aminophthalonitrile of formula (B) may be prepared as follows, starting from commercially available 3-nitro or 4-nitrophthalonitrile:

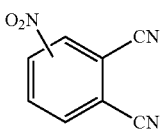 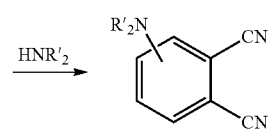
(B)

The amino-alkoxyphthalonitrile of formula (C) may be prepared, for example, by reacting 1,2-dibromo-3-methoxy-5-nitrobenzene with CuCN to form 3-methoxy-5-nitrophthalonitrile which is then treated with a secondary amine to obtain 3-methoxy-5-dialkylaminophthalonitrile.

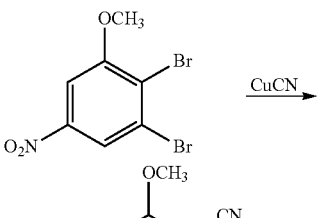
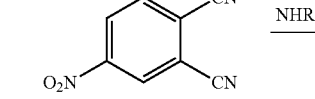 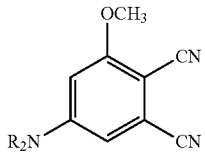

The fluorinated alkoxyphthalonitrile of formula (D) may be prepared as follows:

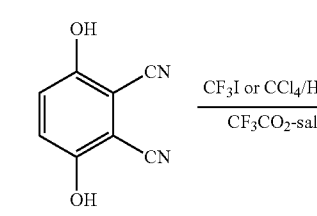 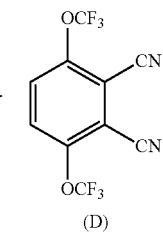
(D)

The fluorinated alkoxyphthalonitrile of formula (E) may be prepared as follows:

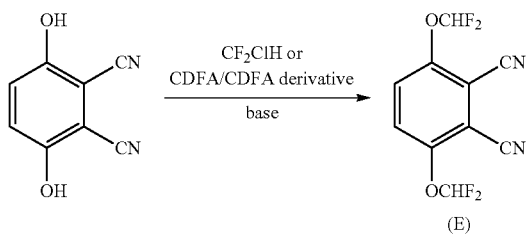

wherein CDFA means chlorodifluoroacetic acid and wherein CDFA derivative is for instance the acid chloride derivative.

The fluorinated alkoxyphthalonitrile of formula (G) may be prepared as follows:

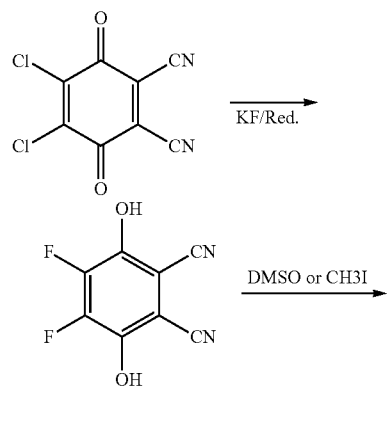

wherein DMSO means dimethylsulfoxide.

The fluorinated alkoxyphthalonitrile of formula (H) may be prepared as follows:

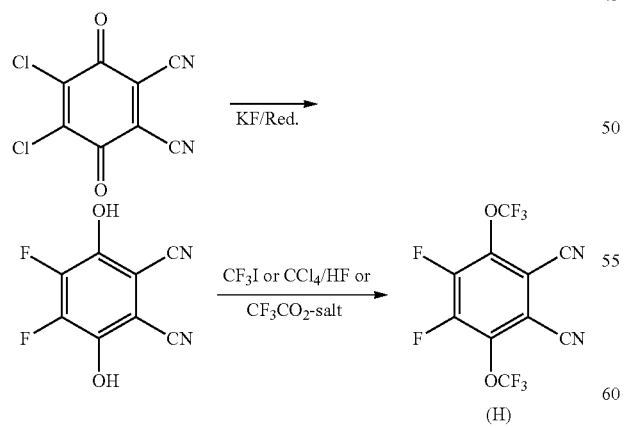

The fluorinated alkoxyphthalonitrile of formula (J) may be prepared as follows:

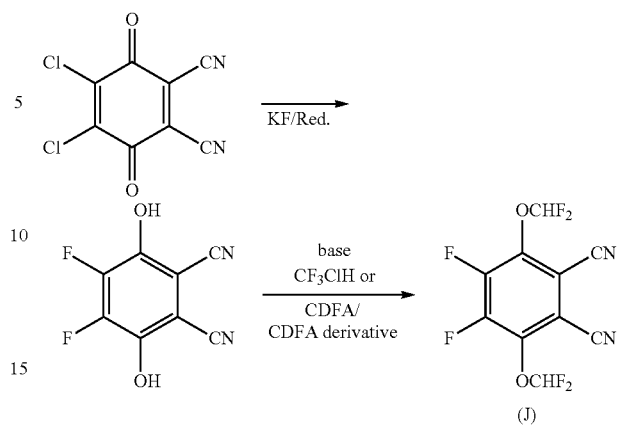

wherein Red. means reducing agent, for instance $H_2$, and wherein CDFA means chlorodifluoroacetic acid and wherein CDFA derivative is for instance the acid chloride derivative.

The fluorinated phthalonitrile of formula (L) may be prepared as follows, starting from commercially available tetrafluorophthalonitrile:

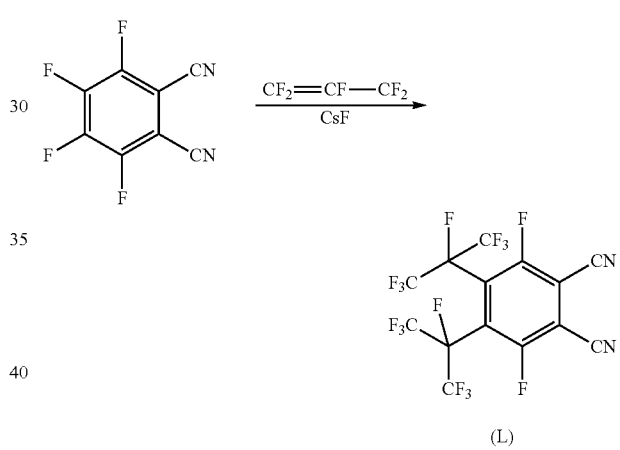

This reaction is preferably conducted at low temperature, for instance around −78° C.

The alkoxy naphthalodinitrile of formula (M) may be prepared as follows, starting from commercially available 2,3-dicyanonaphthalene-1,4-diol:

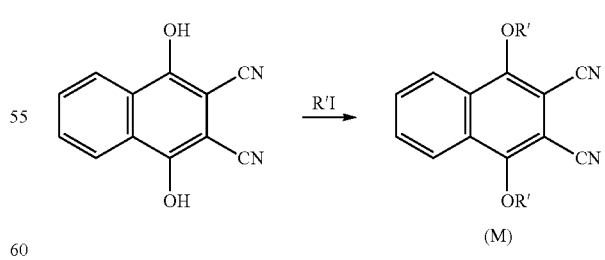

Such a reaction is typically conducted in the presence of a base. The alkoxy naphthalodinitrile of formula (M) might also be prepared by converting the naphthoquinone precursor with hexafluoroisopropanol under drying conditions (e.g. with $SO_3$ or $P_2O_5$) or by converting the naphthoquinone precursor with two equivalents of hexafluoropropylene directly under radicalar conditions (e.g. in the presence of azobisisobutyronitrile (AIBN) or light).

The fluorinated alkoxynahthalodinitrile of formula (N) may be prepared as follows:

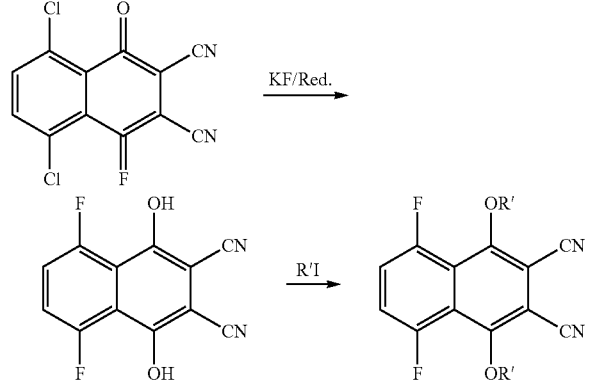

The fluorinated naphthalodinitriles of formula (Q) and (T) may be prepared follows:

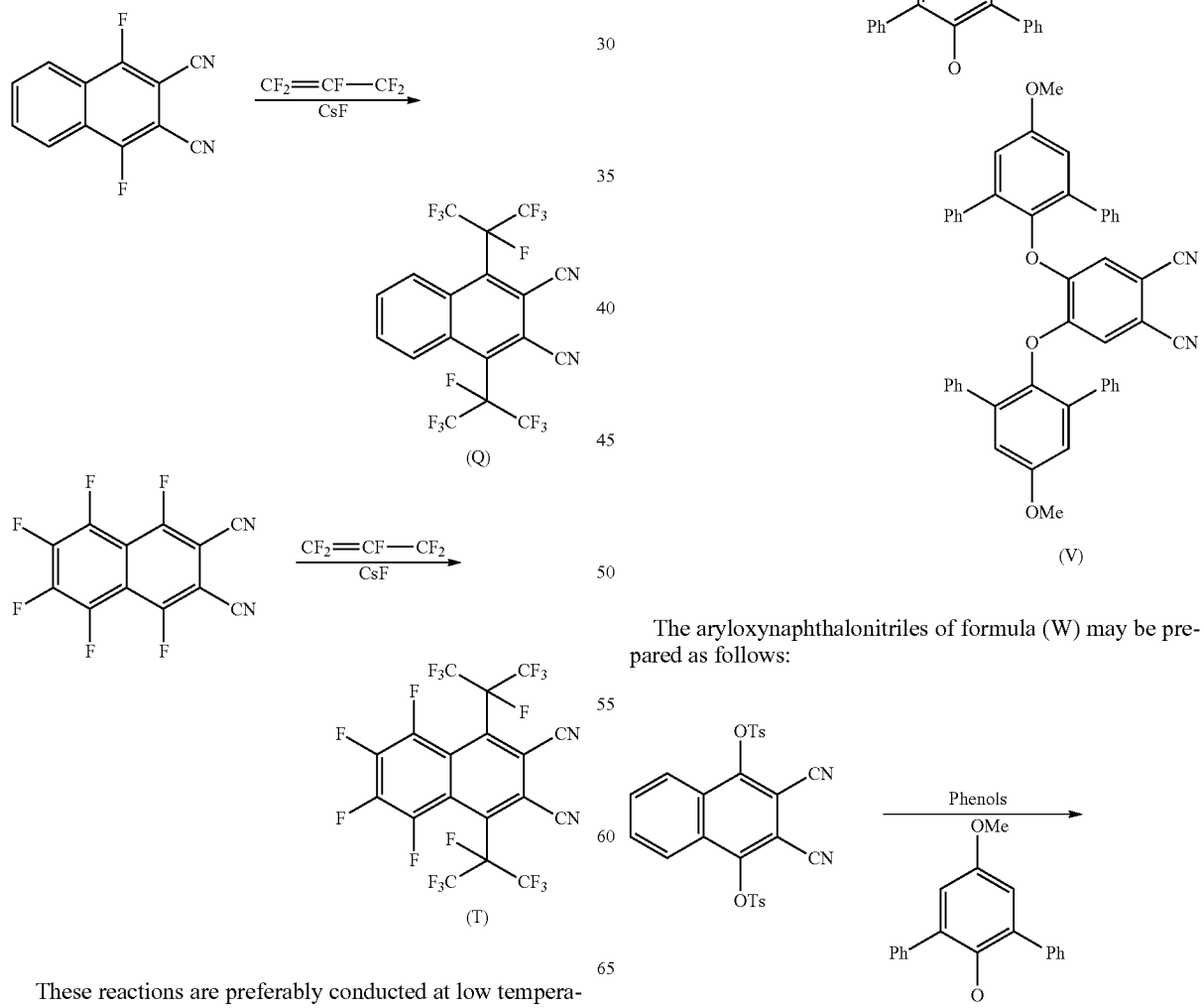

The aryloxyphthalonitriles of formula (U) may be prepared as follows:

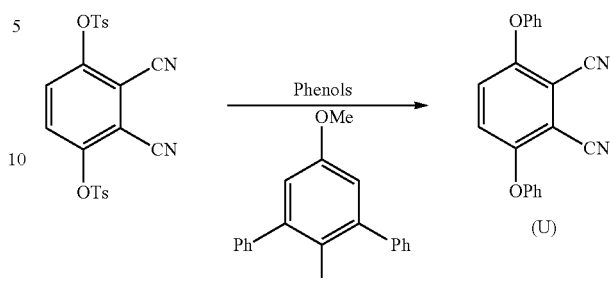

wherein Ts is understood to denote tosyl group.

The aryloxyphthalonitriles of formula (V) may be prepared as follows:

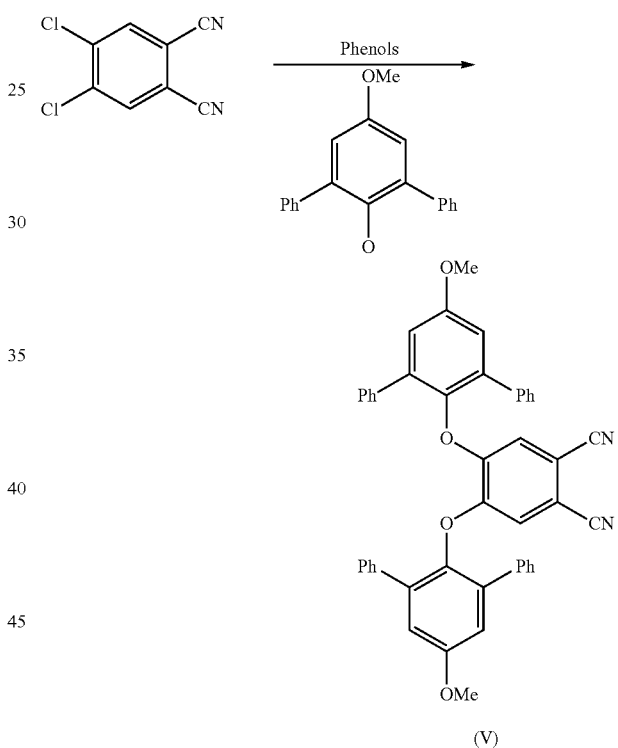

The aryloxynaphthalonitriles of formula (W) may be prepared as follows:

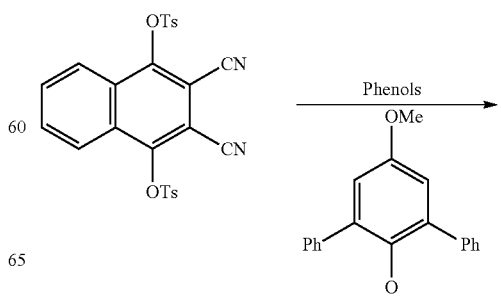

These reactions are preferably conducted at low temperature, for instance around −78° C.

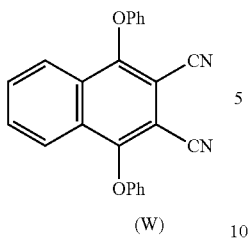

(W)

wherein Ts is understood to denote tosyl group and R' has the same meaning as defined above for compound of formula (X).

The alkylthiophthalonitriles of formula (X) may be prepared as follows:

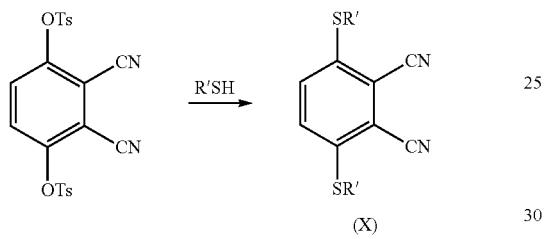

(X)

wherein Ts is understood to denote tosyl group and R' has the same meaning as defined above for compound of formula (X).

The alkylthionaphthalonitriles of formula (Y) may be prepared as follows:

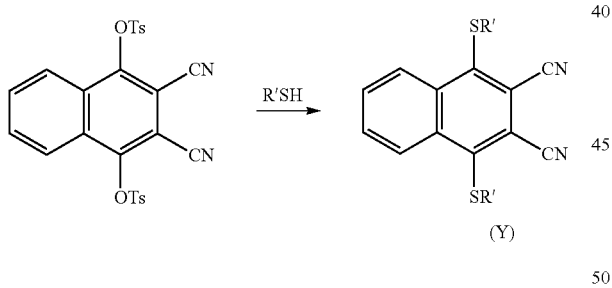

(Y)

wherein Ts is understood to denote tosyl group and R' has the same meaning as defined above for compound of formula (X).

The thiophene building blocks used in the method of preparation of the compounds according to the present invention may be selected from the group consisting of the following 2,3-dicyanothiophene compounds:

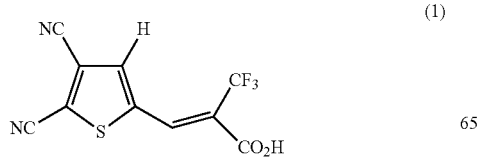

(1)

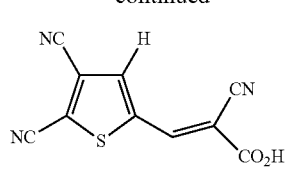

(2)

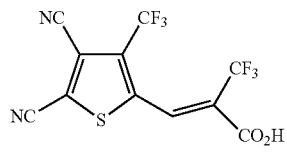

(3)

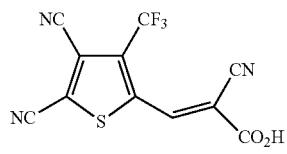

(4)

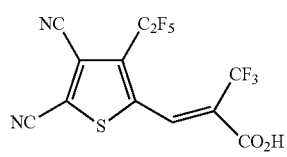

(5)

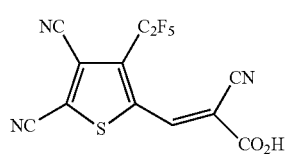

(6)

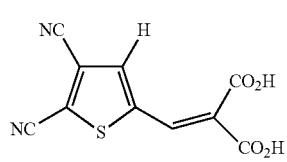

(7)

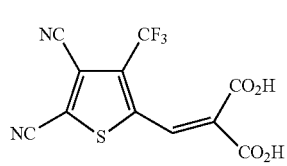

(8)

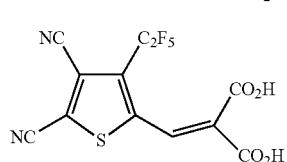

(9)

The present invention also concerns the 2,3-dicyanothiophene compounds of formula (1) to formula (9) described above.

The thiophene building block used in the method for preparing the compound of the present invention is usually prepared from the following precursor:

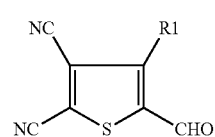

The thiophene used in the method of preparation may be a fluorinated thiophene. It may be selected from the group consisting of fluorinated thiophenes of formula (1), (3), (4), (5) or (6). Also, it may be fluorinated thiophenes of formula (8) or (9).

The thiophene may be a 'F-free' thiophene of formula (1) or (2).

The "F-free" 2,3-dicyanothiophene of formula (1) or (2) may be prepared by a method comprising the following steps, via precursor (A'):

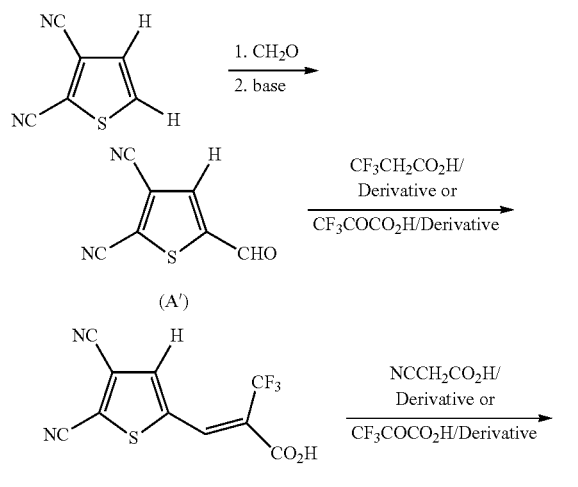

The "F-free" 2,3-dicyanothiophene of formula (1) or (2) may also be prepared by a method comprising the following steps, via the protected form of precursor (A'):

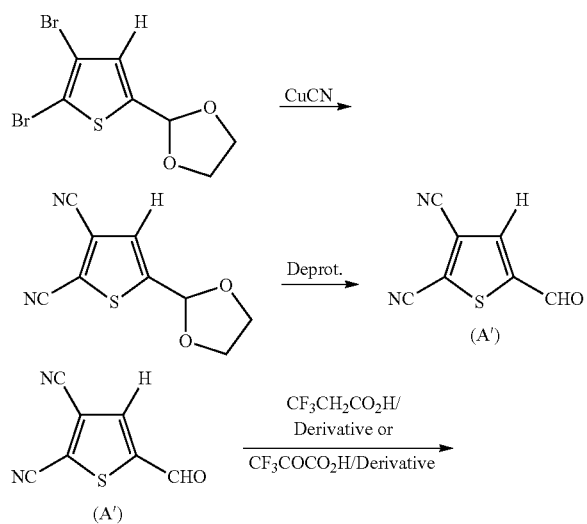

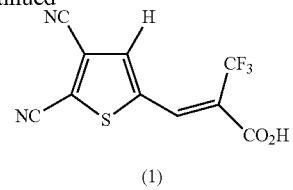

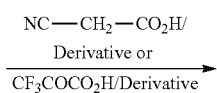

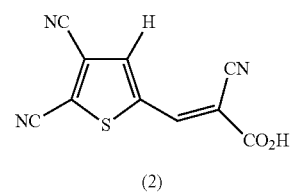

The first reaction, between 4,5-dibromothiophene-2-carbaldehyde and CuCN may for instance be carried out in polar aprotic solvents such as DMF or pyridine.

The thiophene may be a 'CF$_3$' fluorinated thiophene of formula (3) or (4). The fluorinated thiophene of formula (3) or (4) may be prepared by a process employing a thiophene precursor (B'), for instance as follows:

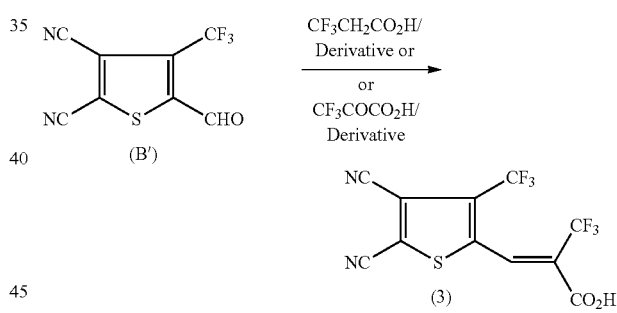

The thiophene precursor (B') may be prepared by a process comprising the following steps:

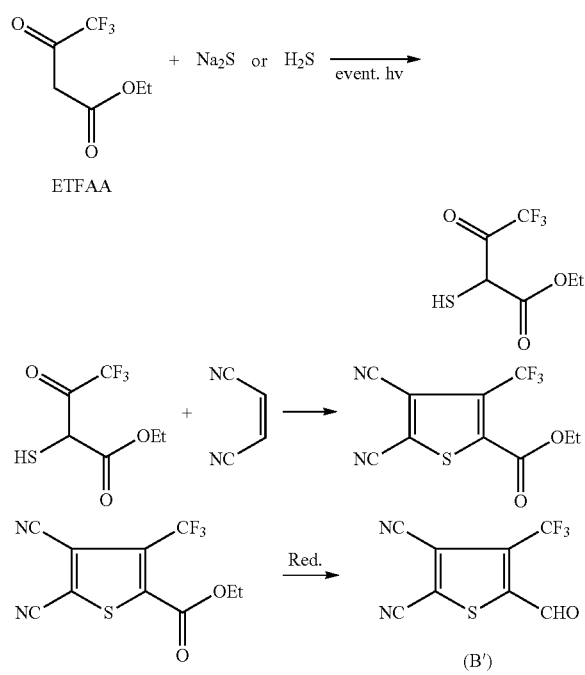

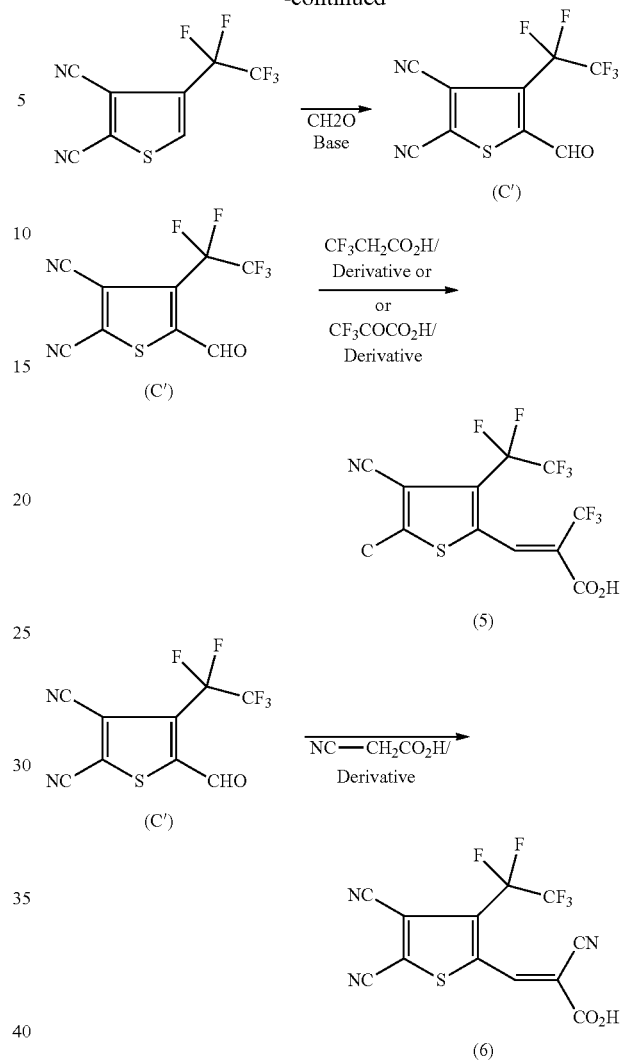

The thiophene may be a pentafluorothiophene of formula (5) or (6). The pentafluorothiophene of formula (5) or (6) may be prepared by a process employing a thiophene precursor (C'):

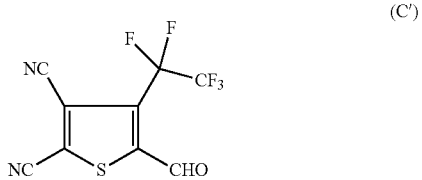 [SMILES: N#Cc1sc(C=O)c(C(F)(F)C(F)(F)F)c1C#N]
(C')

The process may comprise steps to prepare the fluorinated thiophene precursor (C') and/or steps to make either the fluorinated thiophene of formula (5) or (6) from the fluorinated thiophene precursor (C') as follows:

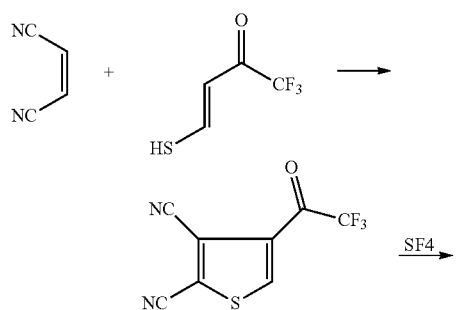

The dicyanothiophene of formula (7), (8) or (9) may be prepared by a method comprising the following steps, from the protected form of precursor (A'):

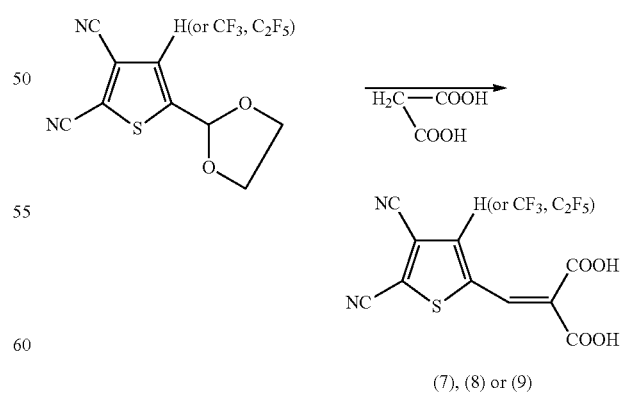

Compound of formula $CF_3—CO—CH=CH—SH$ may for instance be prepared by reacting ethoxy-4,4,4-trifluoro-3-buten-2-one (ETFBO, $CF_3—CO—CH=CH—OEt$) with $H_2S$ or $Na_2S$.

According to a first embodiment, it is possible to react the thiophene building block with the aromatic dinitrile building block in the optional presence of a metal salt or derivative of M to form the compound of the present invention by statistical cyclotetramerization. Such reaction is typically performed by reacting the aromatic dinitrile building block with the thiophene building block in a molar ratio around 3:1.

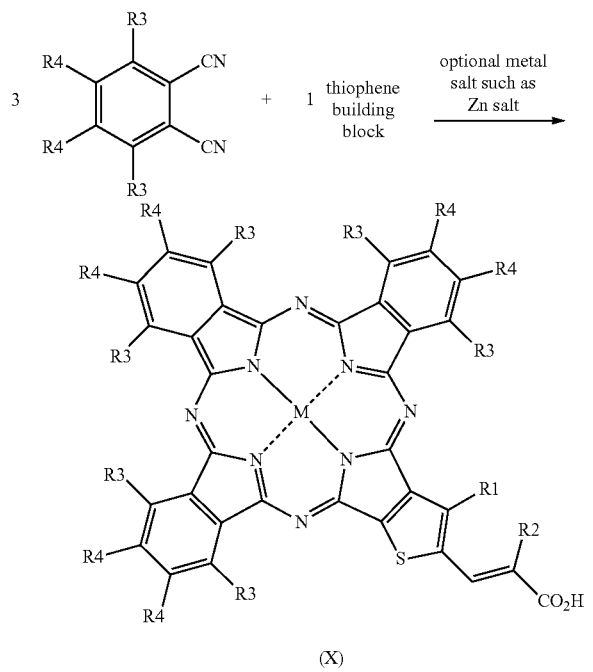

(X)

According to a second embodiment, it is possible to first react the aromatic dinitrile building block with a precursor of the thiophene building block, in the presence of a metal salt or derivative of M, by statistical cyclotetramerization, and to further react the resulting compound to form the compound of the present invention. In such second embodiment, the reaction is typically performed by reacting the aromatic dinitrile building block with a precursor of the thiophene building block in a molar ratio around 3:1, in the optional presence of a metal salt or derivative of M. In said second embodiment, the precursor of the thiophene building block may for instance be selected from precursors (A'), (B') or (C') as described above or from corresponding compounds wherein the aldehyde group has been protected by an acetal group. An example of corresponding compound for precursor (A') is shown below:

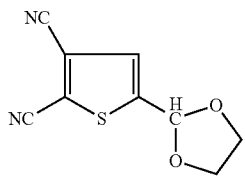 [SMILES: N#Cc1cc(C2OCCO2)sc1C#N]

Such a protected precursor compound may for instance be prepared by reacting precursor compound of formula (A') with ethylene glycol ($HOCH_2$—$CH_2OH$). If such a protected precursor is used, the protecting group is then removed to yield the corresponding aldehyde group. The aldehyde group may then be transformed into the required functionality (i.e. —CH═C($CF_3$)($CO_2H$) or —CH═C(CN)($CO_2H$)), for instance by reaction with $CF_3CH_2CO_2H$, $CF_3COCO_2H$ or $NCCH_2CO_2H$.

In the method of the present invention, the metal salt or derivative of M may for instance be a Zn salt such as zinc acetate, magnesium oxide, an aluminum derivative such as aluminum chloride or bromide, a silicon derivative such as tetrachlorosilane, or a stannous halide ($SnHal_2$) such as tin dichloride ($TiCl_2$).

The compound of the present invention may be further isolated, for instance by column chromatography, preferably by high pressure liquid chromatography (HPLC).

While preferred embodiments of this invention have been shown and described, modifications thereof can be made by one skilled in the art without departing from the spirit or teaching of this invention. The embodiments described herein are exemplary only and are not limiting. Many variations and modifications of systems and methods are possible and are within the scope of the invention. Accordingly, the scope of protection is not limited to the embodiments described herein, but is only limited by the claims that follow, the scope of which shall include all equivalents of the subject matter of the claims.

Should the disclosure of any patents, patent applications, and publications which are incorporated herein by reference conflict with the description of the present application to the extent that it may render a term unclear, the present description shall take precedence.

EXAMPLES

HOMO/LUMO Calculations

HOMO/LUMO calculations were performed using program Hyperchem, Release 4.5, PM3 method, gradient 10 exp–3, next lowest RHF.

FIG. 1 summarizes the HOMO/LUMO calculated levels for the following compounds:

ZnPc 1: unsubstituted zinc phthalocyanine;
ZnPc 2: compound of formula (X) wherein R1=R3=R4=H and R2=CN;
ZnPc 3: compound of formula (X) wherein R1=R3=R4=H and R2=$CF_3$;
ZnPc 4: compound Ia with R1=H (i.e. compound of formula (X) wherein R1=R4=H, R2=CN, and R3=$OCH_3$);
ZnPc 5: compound Va with R1=H (i.e. compound of formula (X) wherein R1=R4=H, R2=$CF_3$, and R3=$OCH_3$);
ZnPc 6: compound VIa with R1=H (i.e. compound of formula (X) wherein R1=R4=H, R2=$CF_3$, and R3=$OCF_3$);
ZnPc 7: compound XIIIa with R1=H (i.e. compound of formula (X) wherein R1=H, R2=CN; R3=F, and R4=CF($CF_3$)$_2$).

These calculations show that, compared to unsubstitsuted zinc phthalocyanine (ZnPc 1), the HOMO/LUMO levels of ZnPc 2 and ZnPc 3 bearing a thiophene unit connected with a cyano- or a trifluoromethylacrylate group are shifted downwards to lower energy. Further introduction of methoxy groups at the three benzene unit in ZnPc 4 and ZnPc 5 shifts the HOMO/LUMO energy levels upwards. Further introduction of fluorinated residues in ZnPc 6 and ZnPc 7 shift the HOMO/LUMO energy levels again downwards.

In the case of ZnPc 1, ZnPc 4 and ZnPc 5, the LUMO level is above the conduction band level of titanium dioxide ($TiO_2$). In the case of the other ZnPc's, the LUMO level is under the conduction band level of titanium dioxide (TiO2). Using titaniumoxy difluoride ($TiOF_2$), which has a lower conduction band level compared to TiO$_2$, it is possible to transfer from the excited state of ZnPc 2, ZnPc 3, ZnPc 6 and ZnPc 7 an electron to this semiconductor.

Absorption Region

The longest wavelength absorptions (Q band) of phthalocyanines are seen at λ=670-700 nm and of naphthalocyanines at 760-780 nm. By introduction of substituents such as alkoxy groups the longest wavelength absorptions of phthalocyanines shift to around 750 nm and of naphthalocyanines to around 860 nm, and extinction coefficients of >10$^5$ L mol$^{-1}$ cm$^{-1}$. Phthalocyanines and naphthalocyanines described in this patent are absorbing in dependence on the kind of substituents between 700-750 nm or 790-860 nm with extinction coefficients of >10$^5$ L mol$^{-1}$ cm$^{-1}$, respectively.

What we claim is:

1. A method for forming a photoelectric conversion device, comprising providing dye sensitized TiOF$_2$ as a semiconductor layer.

2. The method according to claim 1, wherein the TiOF$_2$ is in the form of nanoparticles.

3. The method according to claim 2, wherein the TiOF$_2$ has a mean primary particle size from 15 to 50 nm.

4. The method according to claim 1, wherein the dye comprises a fluorinated dye compound.

5. A photoelectric conversion device comprising a semiconductor layer, wherein the semiconductor layer comprises dye-sensitized TiOF$_2$, and the dye is a compound comprising an element M in a macrocyclic structure having the following formula (X):

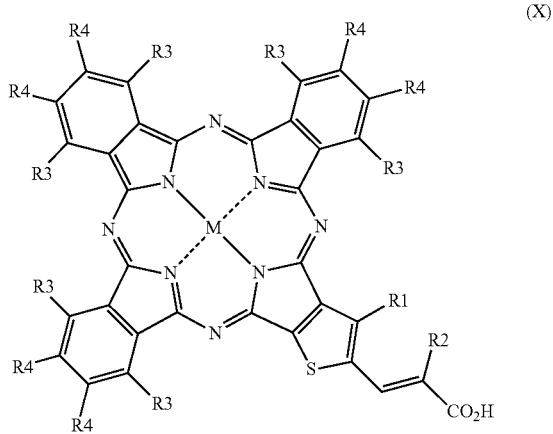

wherein:

M is 2H (metal free analogue), zinc (Zn(II)), magnesium (Mg(II)), Al(III)X, Si(IV)X$_2$, or Sn(IV)X$_2$ wherein X is selected from the group consisting of halides, OH and OR with R being an alkyl or aryl group;

R$_1$ is H or an alkyl group substituted by at least one halogen atom;

R$_2$ is —CN, —COOH or an alkyl group substituted by at least one halogen atom;

R$_3$ is independently selected from the group consisting of H, F, —C$_n$F$_{2n+1}$, —OR', and —NR'$_2$; and R$_4$ are independently selected from the group consisting of H, F, —C$_n$F$_{2n+1}$, —OR', —NR'$_2$, and groups forming an optionally substituted aromatic cycle, adjacent to the external aromatic cycles of the macrocyclic structure;

with R' being independently selected from the group consisting of H; alkyl groups, optionally fluorinated; and aryl groups, optionally fluorinated.

6. The photoelectric conversion device of claim 1, where said compound is fluorinated.

7. A photoelectric conversion device comprising a semiconductor layer, wherein the semiconductor layer comprises dye sensitized TiOF2.

8. The photoelectric conversion device of claim 7, wherein the TiOF2 is in the form of nanoparticles.

9. The photoelectric conversion device of claim 8, wherein the TiOF2 has a mean primary particle size from 15 to 50 nm.

10. The photoelectric conversion device of claim 7, wherein the thickness of the semiconductor layer is from 500 nm to 10 μm.

11. The photoelectric conversion device of claim 7, wherein the semiconductor layer comprises TiOF2 as the sole semiconductor.

12. The photoelectric conversion device of claim 7, further comprising a dense TiO$_2$ layer on a transparent conducting glass electrode.

13. The photoelectric conversion device of claim 7, wherein the semiconductor layer is on a transparent conducting glass electrode.

14. The photoelectric conversion device of claim 13, wherein the transparent conducting glass electrode comprises F doped SnO$_2$ as conducting material.

15. The photoelectric conversion device of claim 7, further comprising a fluorinated dye compound.

* * * * *